US010408691B2

(12) United States Patent
Bradbury et al.

(10) Patent No.: US 10,408,691 B2
(45) Date of Patent: Sep. 10, 2019

(54) FRACTURE RING SENSOR

(71) Applicant: International Business Machines Corporation, Armonk, NY (US)

(72) Inventors: Jonathan D. Bradbury, Poughkeepsie, NY (US); Jonathan R. Fry, Fishkill, NY (US); Michael R. Kane, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

(21) Appl. No.: 15/808,518

(22) Filed: Nov. 9, 2017

(65) Prior Publication Data

US 2019/0107446 A1   Apr. 11, 2019

Related U.S. Application Data

(63) Continuation of application No. 15/725,380, filed on Oct. 5, 2017.

(51) Int. Cl.
  *G01L 1/00*   (2006.01)
  *G01L 1/06*   (2006.01)
  *G01M 99/00*  (2011.01)

(52) U.S. Cl.
  CPC ............ *G01L 1/06* (2013.01); *G01M 99/007* (2013.01); *H05K 2201/10151* (2013.01)

(58) Field of Classification Search
  CPC ............ G01R 31/2817; H05K 1/0268; H05K 2201/10151; G01L 1/06; G01M 99/007
  USPC ........................................................ 73/775
  See application file for complete search history.

(56) References Cited

U.S. PATENT DOCUMENTS

| | | | | |
|---|---|---|---|---|
| 2002/0104369 A1* | 8/2002 | Baker | ............... | G01L 1/20 73/31.06 |
| 2003/0234644 A1* | 12/2003 | Hussain | ............... | G01M 99/007 324/763.01 |
| 2006/0231622 A1* | 10/2006 | Kieffer | ............... | G01L 5/0047 235/449 |
| 2007/0205791 A1* | 9/2007 | Ahmad | ............... | G01R 31/2817 73/862.474 |
| 2007/0283759 A1* | 12/2007 | Schnetker | ............... | G01M 7/025 73/577 |

OTHER PUBLICATIONS

List of IBM Patents or Patent Applications Treated as Related (Appendix P); Filed Nov. 9, 2017, 2 pages.
Jonathan D. Bradbury, et al. "Fracture Ring Sensor," U.S. Appl. No. 15/725,380, filed Oct. 5, 2017.

* cited by examiner

*Primary Examiner* — Max H Noori
(74) *Attorney, Agent, or Firm* — Cantor Colburn LLP; Teddi Maranzano

(57) ABSTRACT

Embodiments of the invention include a fracture ring sensor and a method of using the same to detect out of tolerance forces. Aspects of the invention include a product having a defined an out of tolerance force, a fracture ring sensor, and a mounting assembly coupling the fracture ring sensor to the product. The fracture ring sensor is patterned with a conductive trace and is manufactured to break when subjected to a predetermined amount of force. The predetermined amount of force is substantially equal to a percentage of the out of tolerance force of the product.

4 Claims, 7 Drawing Sheets

FRACTURE RING SENSOR

This application is a continuation of U.S. application Ser. No. 15/725,380, titled "FRACTURE RING SENSOR" filed Oct. 5, 2017, the entire contents of which are incorporated herein by reference.

BACKGROUND

The present invention generally relates to stress monitoring systems, and more specifically, to a fracture ring sensor and a method of using the same to detect out of tolerance forces.

Deflection, torque, and insertion forces are important characteristics of various components in many products for which there are specific critical tolerances. Detecting cases where these deflection, torque, or force tolerances have been exceeded can be important to maintaining a product and to prevent unsafe operating conditions. A printed Circuit Board Assembly (PCBA), for example, is used to mechanically support and electrically connect electronic components using conductive pathways, tracks, or signal traces etched from copper sheets laminated onto a non-conductive substrate. The electronic components can include circuit elements such as capacitors, resistors, or active devices. Damaging the PCB during manufacture, installation, or handling can cause these electronic components or the PCB itself to fail.

One type of failure in the printed circuit board assembly is a strain-induced failure. Strain-induced failures can be caused by subjecting the PCB to sufficiently large deflection, torque, insertion, or shock forces (also known as out of tolerance forces). These strain-induced failures can result, for example, in cracked BGA (ball grid array) solder joints, intermittent opens of conductive traces and joints, cracked printed circuit boards (PCB) and cracked capacitors. Inadvertently operating a damaged PCB or component often exacerbates the problem as powering damaged circuitry can cause further damage to the equipment as well as to electrically coupled components. Damage associated with strain-induced failures reduces overall device yields and profitability.

To ensure product quality and reliability, PCB and component manufacturing and handling standards provide product specific critical tolerances that should not be exceeded. Monitoring for, and detecting, cases where deflection, torque, or other force tolerances have been exceeded is challenging but is necessary to maintain a profitable product line and to prevent unsafe operating conditions.

SUMMARY

Embodiments of the present invention are directed to an apparatus for detecting out of tolerance forces applied to a printed circuit board. A non-limiting example of the apparatus includes a printed circuit board, a fracture ring sensor, and a mounting assembly coupling the fracture ring sensor to the printed circuit board. The fracture ring sensor is patterned with a conductive trace and is manufactured to break when subjected to a predetermined amount of force. The predetermined amount of force is substantially equal to a percentage of an out of tolerance force of the PCB.

Embodiments of the present invention are directed to an apparatus for detecting out of tolerance forces applied to a cable connector socket. A non-limiting example of the apparatus includes a cable connector socket and a fracture ring sensor formed along sidewalls of the cable connector socket. The fracture ring sensor is patterned with a conductive trace and is manufactured to break when subjected to a predetermined amount of force. The predetermined amount of force is substantially equal to a percentage of an out of tolerance force of the cable connector socket.

Embodiments of the present invention are directed to a method for detecting out of tolerance forces applied to a printed circuit board. A non-limiting example of the method includes providing a fracture ring sensor patterned with a conductive trace. The fracture ring sensor is manufactured to break when subjected to a predetermined amount of force. The predetermined amount of force is substantially equal to a percentage of an out of tolerance force of the printed circuit board. The fracture ring sensor is mounted to the printed circuit board and electrical continuity is measured along the conductive trace. An out of tolerance force is detected when electrical continuity along the conductive trace has been terminated.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
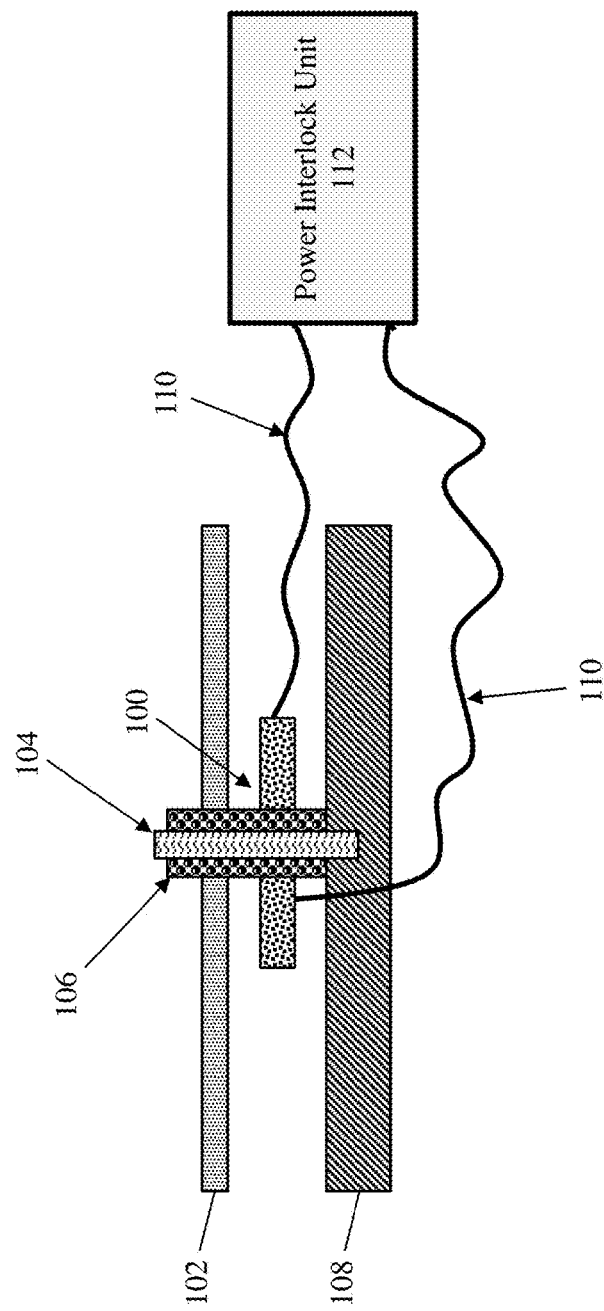
FIG. 1 depicts a fracture ring sensor mechanically coupled to a PCB according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

The present invention is directed towards equipment and methods for testing, validating, and monitoring products having critical tolerances. More particularly the present invention provides a fracture ring sensor and a method of using the same to detect out of tolerance forces. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, critical deflection, torque, and insertion tolerances can be defined for various products, beyond which product reliability, operation, or safety is compromised. For example, subjecting a PCB to excessive impact or deflection forces can damage the PCB and any components in or coupled to the PCB. Strain-induced failures substantially impact product reliability and profitability. Consequently, monitoring for and detecting out of tolerance forces in a product is necessary. With some generality, a few conventional solutions exist for monitoring or detecting out of tolerance forces in a PCB.

In one approach, sacrificial strain gauges are embedded onto or directly mounted to the surface of the PCB with separate signal lead wires attached to each strain gauge. These sacrificial strain gauge sensors are glued or otherwise affixed to the top surface of the printed circuit board and attached to electrical circuitry via leadwires attached to the sensors. Typical strain gauge monitoring systems rely on thin, non-ductile pieces of material (e.g., alumina) which will break under sufficient deformation.

There are several disadvantages associated with the use of strain gauges. Strain gauges must be directly mounted to the PCB, and consequently, valuable surface area is required which could otherwise be used for the primary purpose of the board. Another disadvantage of strain gauges based on thin, non-ductile materials is that these detectors can only work in one direction. Deflection must be parallel to the orientation of the strand, so as to cause tensile or compressive forces along the length of the thin piece. Sensing forces in multiple orientations requires a plurality of strain gauges. A further limitation of strain gauges is their limited use in circuit boards and assemblies that employ stiffener plates. In those applications the circuit board itself cannot be warped, but can still be compressed, having critical dimensions from mount points warped, or have structure body elements displaced. Strain gauge-based sensors cannot detect these types of faults.

Other approaches rely on active pressure sensors. These sensors are embedded within the PCBAs and rely on some combination of cantilevers, diaphragms, elastic bodies, and recessed elements electrically coupled to a pressure sensor circuit element. As active sensors, pressures can only be observed when the sensors are actively being monitored. These pressure sensors do not possess hysteresis or the ability to detect stress without power (i.e., while not being directly polled). In addition, these sensors are designed for repeatable use with mild stress and are not typically suitable for more catastrophic or damaging stresses. Active pressure sensors detect compressive deformation in the vertical plane relative to the sensor and, similarly to strain gauges, are not omnidirectional.

In another approach, strain capacitors are mounted onto the PCB. Strain capacitors can include metal-ceramic strain sensing elements and can monitor the health of a circuit board under deflection. Overstress and damage conditions are detected when the capacitor cracks, causing changes in capacitance, or opens/shorts in a sensing circuit. As these capacitors must be surface mounted or similarly affixed directly to the PCB, valuable surface area is required which could otherwise be used for the primary purpose of the board. In cases with boards using stiffener plates, or where there is damage to mount points, strain capacitor-based solutions will not detect faults. Furthermore, since the wiring for these capacitors is embedded into the circuit board, damage to the board itself may prevent operation of the sensor. In other words, some integrity of the board is required to perform capacitor-based sensing functions. Moreover, integration of the sensor on or within the PCB means that, while sacrificial, the sensor cannot be easily replaced.

Turning now to an overview of aspects of the present invention, one or more embodiments of the invention provide a fracture ring sensor and a method of using the same to detect out of tolerance forces applied to a product. In some embodiments of the present invention, an inelastic, non-conductive disk or ring patterned with conductive traces is mechanically coupled to a mounting point on the product. Electrical continuity along the conductive traces can be monitored periodically or in real-time using electrical contacts coupled to the traces.

The fracture ring sensor offers several advantages over conventional systems. Each disk or ring can be mechanically designed to fracture when subjected to a specific out of tolerance force and/or deflection (leveraging, e.g., the known yield strength of the sensor material). When the targeted out of tolerance force or deflection is applied to the fracture ring sensor the sensor cracks and breaks electrical continuity along the conductive trace. In this manner, the fracture ring sensor operates as a single use fuse which can indicate failure both electrically (checking continuity along traces) and physically (observed deformation, cracking, damage). Moreover, because the fracture ring sensor design naturally provides a hysteresis memory, product damage can be indicated after the fact and even when the device is powered down, allowing for integrity checks to be completed prior to device operation. Consequently, the fracture ring sensor is well-suited to environments where direct electrical sensing is not desirable (e.g., applications having a high potential for shorts) or possible (e.g., radiation). In some embodiments of the present invention, hysteresis is leveraged to provide a power interlock system whereby the product is prevented from powering up if the fracture ring sensor is damaged.

The targeted out of tolerance force or deflection for a fracture ring sensor can be arbitrarily adjusted by increasing or decreasing the thickness of the disk or ring, by changing the sensor material, and by pre-damaging the sensor (i.e., scoring the surface of the disk or ring). In this manner, the fracture ring sensor can be tuned to break prior to actual product damage, allowing for inspection, correction, and return to normal service. The fracture ring sensor can be mechanically coupled to the product using indirect fastening points. For example, the fracture ring sensor can be coupled to a PCB using a PCB stand-off. Consequently, directly mounting a sensor to the product (e.g., PCB) is avoided and valuable board surface area is preserved. Indirectly coupling the fracture ring sensor also prevents any damage to the product itself from preventing or limiting the operation of the sensor. Another advantage of the fracture ring sensor is that the disk or ring-based configuration provides omnidirectional stress, torque, and compression detection and is suitable for use even in applications having stiffener plates.

Turning now to a more detailed description of aspects of the present invention, FIG. 1 depicts a view of a fracture ring sensor 100 mechanically coupled to a product 102 according to one or more embodiments of the invention. In some embodiments of the present invention, the product 102 is a PCB. In some embodiments of the present invention, the product 102 is a product having critical deflection, torque, and insertion tolerances beyond which the product's reliability, operation, or safety is compromised, such as, for example, a LCD screen mounting point, server component, medical device component, industrial equipment component, aviation component, scientific component, or fault-tolerant/high uptime system component.

In some embodiments of the present invention, the fracture ring sensor 100 is coupled to the product 102 using known PCB stand-off connections (also known as a mounting point). In some embodiments of the present invention, the PCB stand-off connection includes a fastener 104 that is threaded or otherwise passed through a collar 106 and into a chassis 108. In this manner, deflection, torque, and/or insertion forces applied to the product 102 will be physically transferred through the PCB stand-off connection to the fracture ring sensor 100.

In some embodiments of the present invention, a gap or spacing exists between the fracture ring sensor 100 and the product 102 (as depicted in FIG. 1). In other embodiments of the present invention, the fracture ring sensor 100 is instead in direct contact with the product 102. The sensor-to-PCB spacing distance can be adjusted based on the design requirements of the specific application and can range from 0 to 10 or more mm. For example, the spacing can be increased in applications where the design specification allows for some flex of the PCB and a flush mount (direct contact) can be used when no flex is allowed. While only a single fracture ring sensor 100 is depicted for ease of illustration, it is understood that a plurality of fracture ring sensors can be coupled to a single PCB. In some embodiments of the present invention, a plurality of fracture ring sensors is equally distributed along the PCB (not depicted). In other embodiments of the present invention, fracture ring sensors are concentrated along particular points of interest of the PCB (e.g., concentrated along the board edge and/or center, along high power regions, under chips, etc.).

Figure 2:
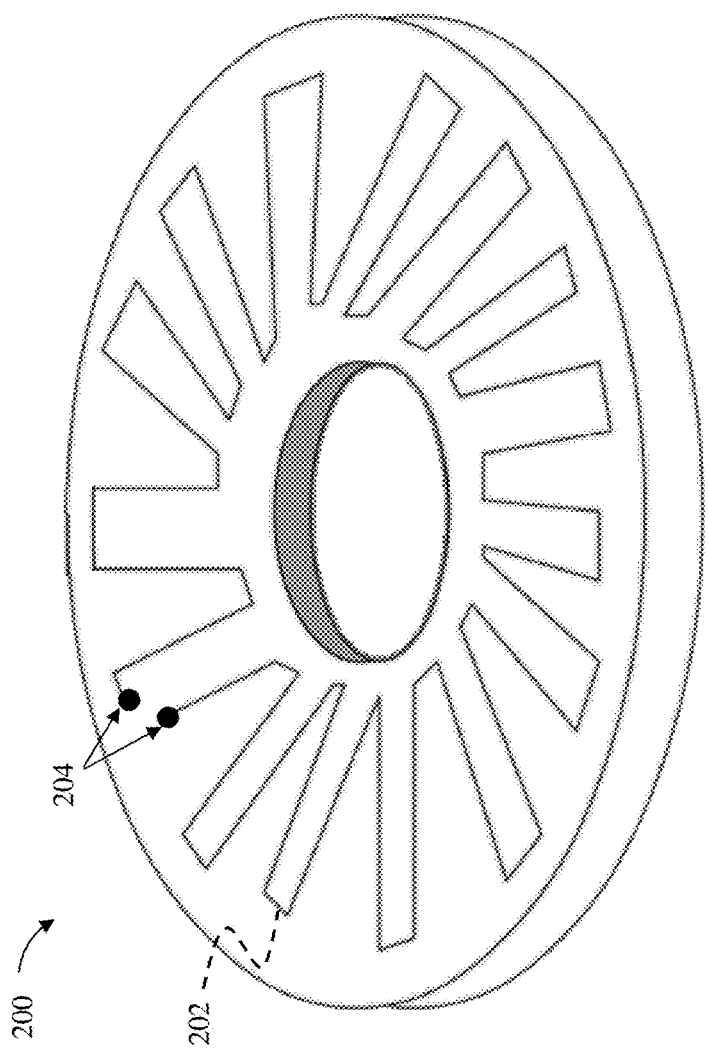
FIG. 2 depicts a detailed view of a fracture ring sensor formed according to one or more embodiments of the invention.
Figure 3:
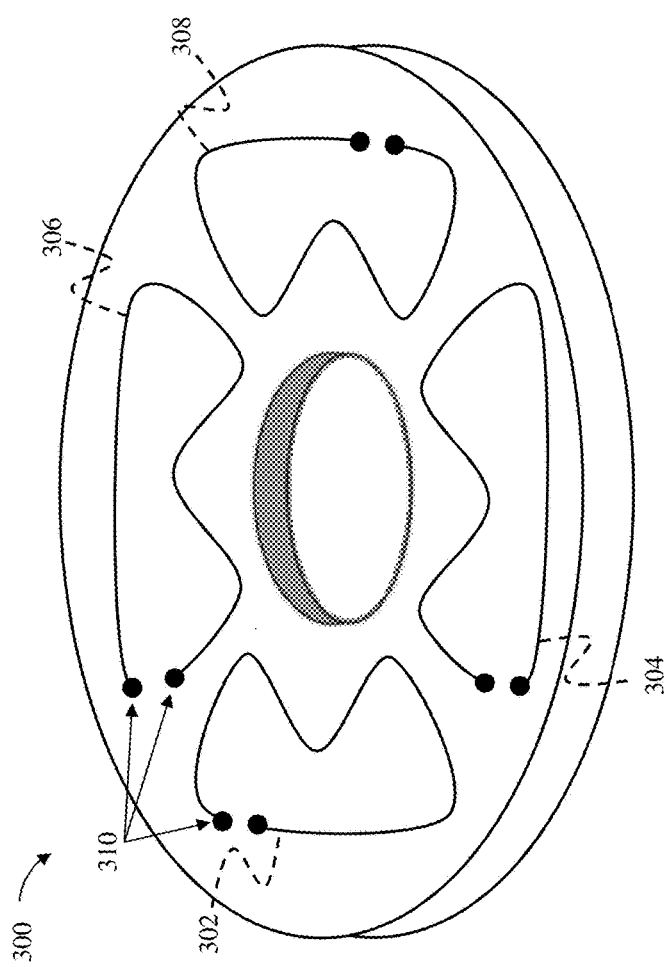
FIG. 3 depicts a detailed view of another fracture ring sensor formed according to one or more embodiments of the invention.

In some embodiments of the present invention, electrical contacts 110 are electrically coupled to portions of a conductive trace patterned onto a surface of the fracture ring sensor 100 (as depicted in FIGS. 2 and 3). Electrical continuity between the electrical contacts 110 can be sensed periodically or in real time. Damage to the conductive trace(s) patterned onto the fracture ring sensor 100 will terminate the electrical continuity between the electrical contacts 110. In this manner, the condition of the fracture ring sensor 100 can be electrically sensed by monitoring the electrical continuity between the electrical contacts 110.

In some embodiments of the present invention, the electrical contacts 110 are further electrically coupled to a power interlock unit 112. The power interlock unit 112 measures electrical continuity between the electrical contacts 110. In some embodiments of the present invention, the power interlock unit 112 can prevent the product 102 from being powered on when electrical continuity between the electrical contacts 110 is broken. In some embodiments of the present invention, the power interlock unit 112 records the time at which electrical continuity between the electrical contacts 110 terminated. In this manner, the exact time the product 102 was damaged is accurately recorded and available for diagnostics. In some embodiments of the present invention, the power interlock unit 112 can be electrically powered separately from the product 102. In other words, the power interlock unit 112 can be powered on while the product 102 remains in a powered-off state. Consequently, electrically sensing continuity between the electrical contacts 110 is possible without powering the product 102 and the product 102 condition (i.e., whether the product 102 has been subjected to an out of tolerance force) can be determined prior to allowing power to the product 102.

FIG. 2 depicts a detailed view of a fracture ring sensor 200 formed according to one or more embodiments of the invention. In some embodiments of the present invention, the fracture ring sensor 200 is patterned with a single conductive trace 202. Electrical contacts 204 are electrically coupled to opposite ends of the conductive trace 202. In this manner, electrical continuity along the conductive trace 202 can be measured. It is understood that the specific conductive trace 202 patterning depicted in FIG. 2 is for illustration only, and that other trace patterns are available. In some embodiments of the present invention, the fracture ring sensor 200 is patterned using a different conductive trace. The conductive trace 202 patterning can be designed based on various considerations, such as ensuring a large amount of surface area coverage, providing coverage near the edge of the fracture ring sensor 200, and manufacturability (i.e., cost or difficulty in patterning a particular conductive trace). Moreover, while the conductive trace 202 is depicted as a surface patterning of the fracture ring sensor 200, in some embodiments of the present invention the conductive trace 202 is embedded within the fracture ring sensor 200. In other words, the conductive trace 202 can be sandwiched between opposite portions of the fracture ring sensor 200.

The fracture ring sensor 200 is engineered using suitable techniques for manufacturing pressure burst rings or rupture disks such that the fracture ring sensor 200 will break at a specific threshold, destroying electrical continuity between the electrical contacts 204. In other words, the material and thickness of the fracture ring sensor 200 is adjusted to ensure that the fracture ring sensor 200 will fracture or break at a specific out of tolerance force or at a required threshold prior to an out of tolerance force. For example, the fracture ring sensor 200 can be designed to fracture at 99, 98, 95, 90, 85, 70, 50, or 20 percent of the PCB out of tolerance force.

The fracture ring sensor 200 must be brittle enough to yield at a specified amount of force or PCB deformation but strong enough to withstand typical handling. Material considerations for the fracture ring sensor 200 are based in part on the known yield strength of the material (also known as the break strength) and the specified out of tolerance force for a given application. Suitable materials include non-conductive, brittle, and/or inelastic materials such as, for example, ceramics, glass, fiber-resin composites. Other suitable materials include those used for manufacturing known pressure burst rings or rupture disks. Once a suitable material is selected the design thickness of the fracture ring sensor 200 can be adjusted based on the required out of tolerance force. For example, the thickness of the fracture ring sensor 200 can be increased to increase the force required to break the fracture ring sensor 200. The available thicknesses for a particular fracture ring sensor are based in part on the materials selected for the fracture ring sensor (e.g., glass can be manufactured to a thickness of about 0.25 mm, fiber-resins can be manufactured to a thickness of about 0.1 mm). In some embodiments of the present invention, the thickness of the fracture ring sensor 200 is about 0.1 mm to about 10 mm.

If a further adjustment to the break strength is needed, the fracture ring sensor 200 can be pre-damaged. In some embodiments of the present invention, defects are distributed throughout the fracture ring sensor 200 to lower the break strength. These defects can include, for example, scoring lines. The amount of scoring can be increased or decreased to modulate the break strength of the fracture ring sensor 200. Control of the fracture ring sensor 200 material and thickness and the ability to add additional defects to the fracture ring sensor 200 surface allows for a fracture ring sensor 200 to be designed having an arbitrary break strength. In some embodiments of the present invention, the fracture ring sensor 200 is designed using a Weibull distribution of break strengths based on the needs of a given application and in consideration of desired mechanical force tolerances.

In some embodiments of the present invention, the fracture ring sensor 200 is designed to fracture under a particular compressive force resulting from a screw torque applied to the product 102 or fastener 104. The conversion of screw torque into compressive force depends on a number of variables, including the materials of the screw, substrate/socket material, presence of lubricants/adhesive agents, etc. Performance curves can be extracted for any given configuration of materials and circumstances to relate torque to compressive force using known techniques. In some embodiments of the present invention, these performance curves are entered as a design consideration for the fracture ring sensor 200.

FIG. 3 depicts a detailed view of a fracture ring sensor 300 formed according to one or more embodiments of the invention. The fracture ring sensor 300 is patterned with multiple conductive traces 302, 304, 306, and 308. Electrical contacts 310 are electrically coupled to opposite ends of the conductive traces 302, 304, 306, and 308. It is understood that the conductive traces 302, 304, 306, and 308 are for illustrative purposes only and that fewer or more conductive traces are possible. For example, 2, 3, 4, 5, 10, or 20 individual traces can be patterned only the fracture ring sensor 300. Moreover, each of the conductive traces 302, 304, 306, and 308 need not share a similar patterning or electrical contact position. The fracture ring sensor 300 is an alternative embodiment of the fracture ring sensor 200 having a single conductive trace 202 (as depicted in FIG. 2). The fracture ring sensor 300 advantageously increases monitoring precision by allowing regional sensing of the fracture ring sensor 300. In other words, damage to a specific portion of the fracture ring sensor 300 can be sensed and reported.

Figure 4:
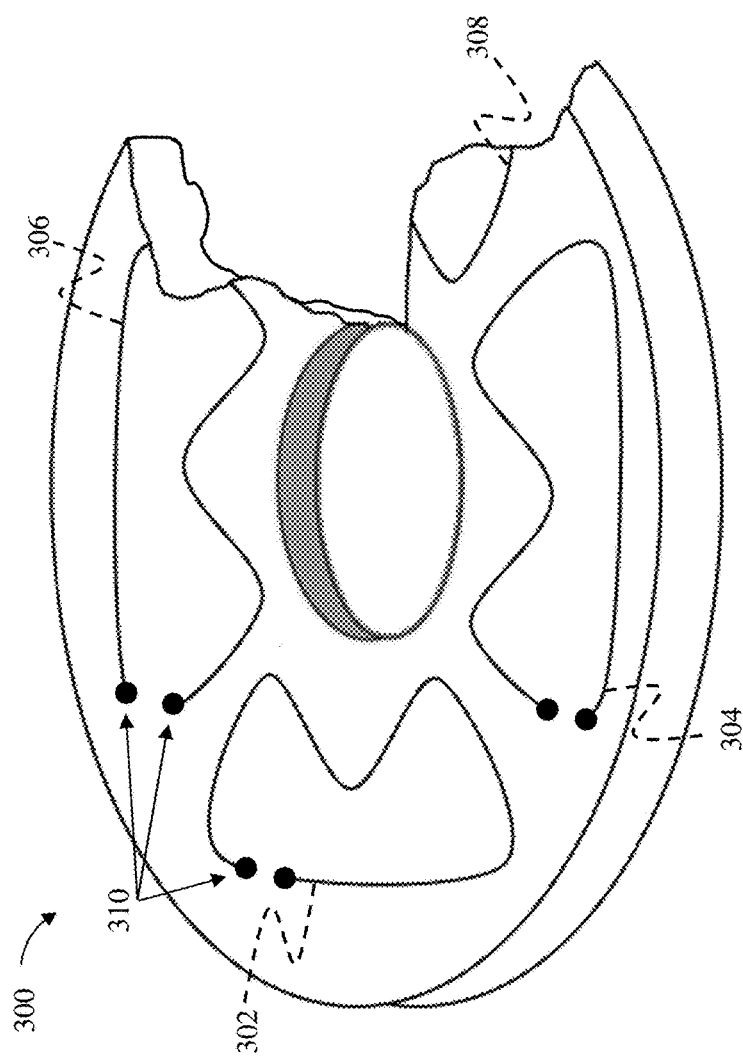
FIG. 4 depicts a detailed view of a fracture ring sensor after being subjected to an out of tolerance force according to one or more embodiments of the present invention.

FIG. 4 depicts a detailed view of the fracture ring sensor 300 after being subjected to an out of tolerance force according to one or more embodiments of the present invention. As depicted, the fracture ring sensor 300 has fractured, destroying electrical continuity along the conductive traces 306 and 308. Electrical continuity along the conductive traces 302 and 304 is maintained. In this manner damage to specific regions of the fracture ring sensor 300 can be electrically sensed according to one or more embodiments of the present invention. Moreover, physical inspection of the fracture ring sensor 300 can independently indicate that a PCB coupled to the fracture ring sensor 300 has been subjected to an out of tolerance force, according to one or more embodiments of the present invention. As discussed previously herein, the availability of physical inspection (or electrical inspection when electrically decoupled from a PCB board) allows for the detection of out of tolerance forces in an off-power state.

Figure 5A:
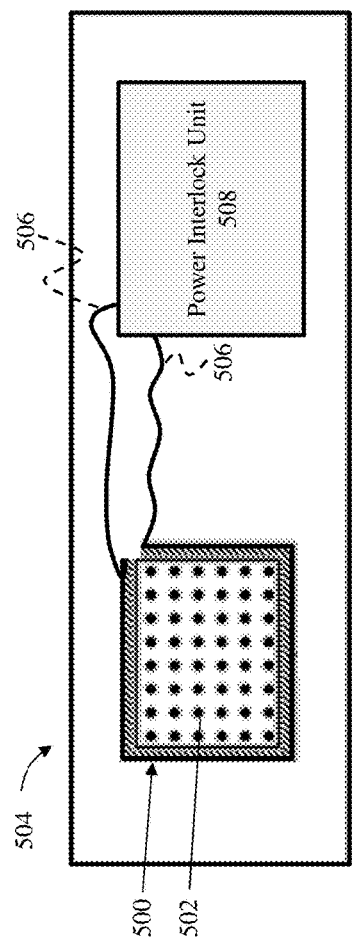
FIG. 5A depicts a front side view of a fracture ring sensor incorporated along sidewalls of a cable connector socket of a computer according to one or more embodiments of the present invention.

FIG. 5A depicts a front side view of a fracture ring sensor 500 incorporated along sidewalls of a cable connector socket 502 of a computer 504 according to one or more embodiments of the present invention. The fracture ring sensor 500 is manufactured in a similar manner as the fracture ring sensors 200 and 300 depicted in FIGS. 2 and 3, discussed previously herein. The fracture ring sensor 500 is patterned with conductive traces (not depicted) coupled to electrical contacts 506. In this manner, the fracture ring sensor 500 serves as a protective collar around the cable connector socket 502. The electrical contacts 506 are further electrically coupled to a power interlock unit 508. The power interlock unit 508 senses electrical continuity between the electrical contacts 506 according to one or more embodiments of the present invention. As depicted the power interlock unit 508 is incorporated within the computer 504. In some embodiments of the present invention, the power interlock unit 508 is instead external to the computer 504.

The fracture ring sensor 500 is designed to fracture or otherwise break when subjected to an out of tolerance force as discussed previously herein. In some embodiments of the present invention, the out of tolerance force corresponds to a cable seating force or torque that is sufficient to damage connector pins within the cable connector socket 502. In this manner, the power interlock unit 508 can prevent power to circuits having damaged connector pins and further damage to electrically coupled circuits can be prevented.

Figure 5B:
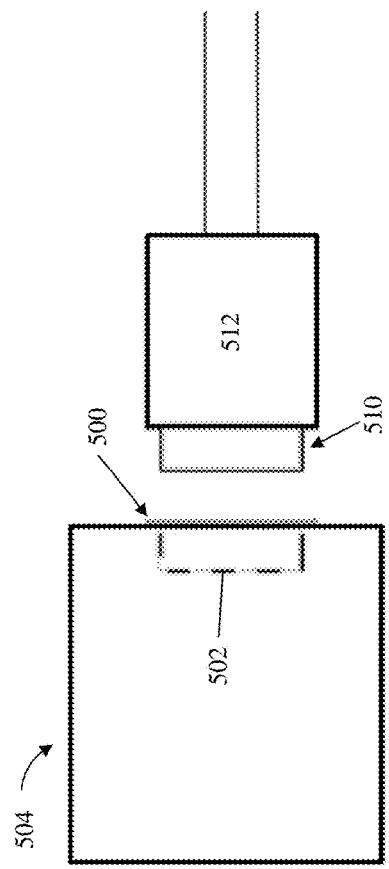
FIG. 5B depicts a plan view of the fracture ring sensor depicted in FIG. 5A according to one or more embodiments of the present invention.

FIG. 5B depicts a plan view of the fracture ring sensor 500 depicted in FIG. 5A according to one or more embodiments of the present invention. In some embodiments of the present invention, the fracture ring sensor 500 is in direct contact (i.e., there is no gap) with the connector socket 502. In this manner, inserting a socket 510 of a cable 512 into the connector socket 502 will bring the socket 510 into contact with the fracture ring sensor 500.

Figure 6A:
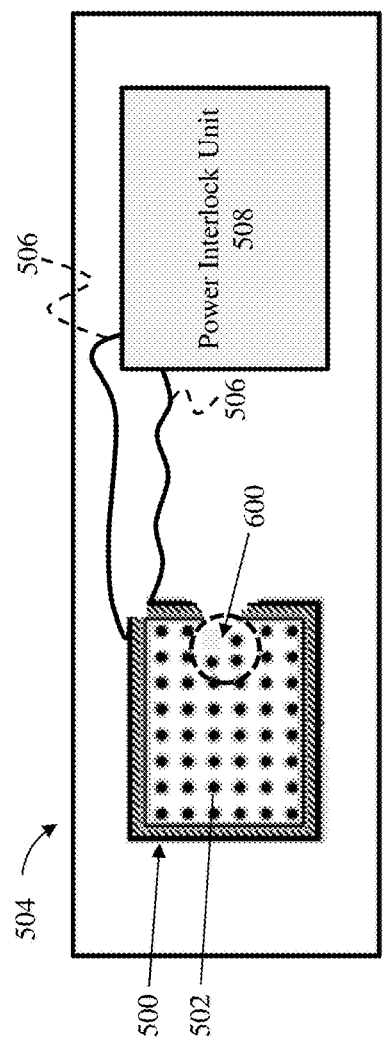
FIG. 6A depicts a front side view of a fracture ring sensor after being subjected to an out of tolerance force according to one or more embodiments of the present invention.

FIG. 6A depicts a front side view of the fracture ring sensor 500 after being subjected to an out of tolerance force according to one or more embodiments of the present invention. Some of the connector pins 600 have been broken off or partially displaced. Consequently, electrically coupling a cable to the cable connector socket 502 could damage the computer 504 and/or the connected equipment. As depicted, the fracture ring sensor 500 has fractured, destroying electrical continuity between the electrical contacts 506. The power interlock unit 508 prevents power from being restored or provided to the cable connector socket 502 and the computer 504 and any potentially connected equipment is protected.

Figure 6B:
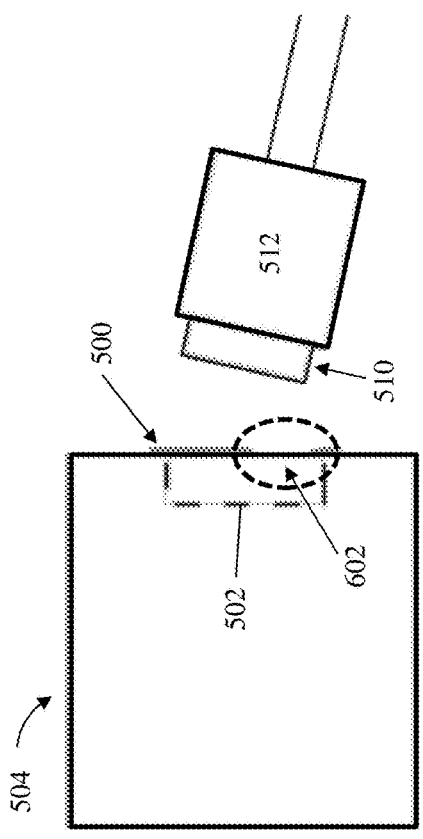
FIG. 6B depicts a plan view of the fracture ring sensor depicted in FIG. 6A according to one or more embodiments of the present invention.

FIG. 6B depicts a plan view of the fracture ring sensor 500 depicted in FIG. 6A according to one or more embodiments of the present invention. From this view it is clear that the cable 512 was improperly removed from the cable connector socket 502, damaging a portion 602 of the fracture ring sensor 500. Once damage to the fracture ring sensor 500 is indicated, the cable connector socket 502 can be inspected. If necessary, the cable connector socket 502 and the fracture ring sensor 500 can be fixed or replaced prior to resuming normal operation.

Figure 7:
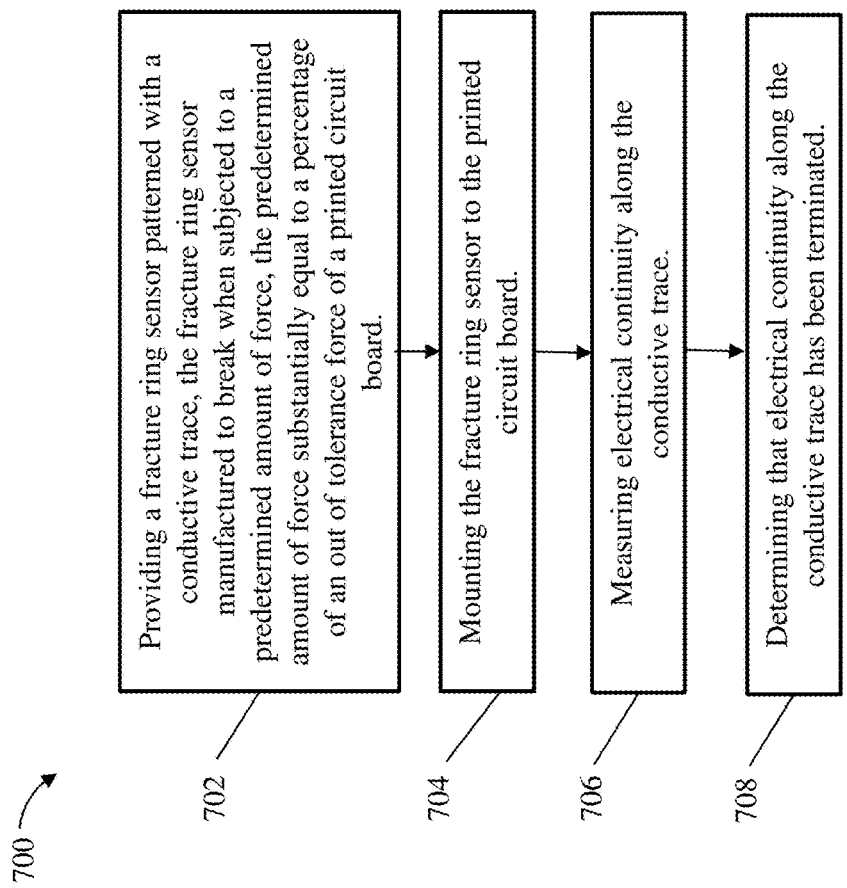
FIG. 7 depicts a flow diagram of a method for detecting out of tolerance forces applied to a printed circuit board according to one or more embodiments of the invention.

FIG. 7 depicts a flow diagram of a method of using a fracture ring sensor to detect out of tolerance forces applied to a printed circuit board according to one or more embodiments of the invention. The method 700 includes providing, at block 702, a fracture ring sensor patterned with a conductive trace. The fracture ring sensor is manufactured to break when subjected to a predetermined amount of force. The predetermined amount of force is substantially equal to a percentage of an out of tolerance force of the printed circuit board.

At block 704, the method 700 includes mounting the fracture ring sensor to the printed circuit board. In some embodiments of the present invention, the fracture ring sensor is mounted to the printed circuit board using a PCB stand-off. The method 700, at block 706, includes measuring electrical continuity along the conductive trace. Block 708 includes determining that electrical continuity along the conductive trace has been terminated. The termination of electrical continuity indicates that the printed circuit board has been subjected to an out of tolerance force.

Additional processes may also be included. It should be understood that the processes depicted in FIG. 7 represent illustrations and that other processes may be added or existing processes may be removed, modified, or rearranged without departing from the scope and spirit of the present disclosure.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±12%, 8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for detecting out of tolerance forces applied to a printed circuit board, the method comprising:

providing a fracture ring sensor comprising a conductive trace, the fracture ring sensor manufactured to break when subjected to a predetermined amount of force, the predetermined amount of force substantially equal to a percentage of an out of tolerance force of the printed circuit board;

mounting the fracture ring sensor to the printed circuit board;

measuring electrical continuity along the conductive trace; and determining that electrical continuity along the conductive trace has been terminated.

2. The method of claim 1 further comprising recording a time at which electrical continuity terminated.

3. The method of claim 1, wherein electrical continuity along the conductive trace is measured by a power interlock unit.

4. The method of claim 3, wherein the power interlock unit prevents power to the printed circuit board based on a determination that electrical continuity along the conductive trace has been terminated.

* * * * *